United States Patent [19]
Yokota et al.

[11] 4,433,893
[45] Feb. 28, 1984

[54] PROCESS FOR PRODUCING HOLOGRAMS

[75] Inventors: Masazi Yokota; Masaru Noguchi, both of Saitama, Japan

[73] Assignee: Fuji Photo Film Co., Ltd., Asaka, Japan

[21] Appl. No.: 338,940

[22] Filed: Jan. 12, 1982

[30] Foreign Application Priority Data

Jan. 12, 1981 [JP] Japan .................. 56-2904

[51] Int. Cl.³ .................................... G03H 1/22
[52] U.S. Cl. ............................ 350/3.61; 430/323
[58] Field of Search ................ 430/1, 2, 321, 323; 350/3.61

[56] References Cited

U.S. PATENT DOCUMENTS 3,944,420  3/1976  Gale et al. .................. 350/3.61
4,056,395  11/1977  Sato et al. .................. 430/323

Primary Examiner—Bruce Y. Arnold
Attorney, Agent, or Firm—Sughrue, Mion, Zinn, Macpeak and Seas

[57] ABSTRACT

A hologram having excellent durability and high diffraction efficiency and process for producing same is disclosed, wherein a glass hologram is subjected to a surface treatment with hydrofluoric acid.

2 Claims, 1 Drawing Figure

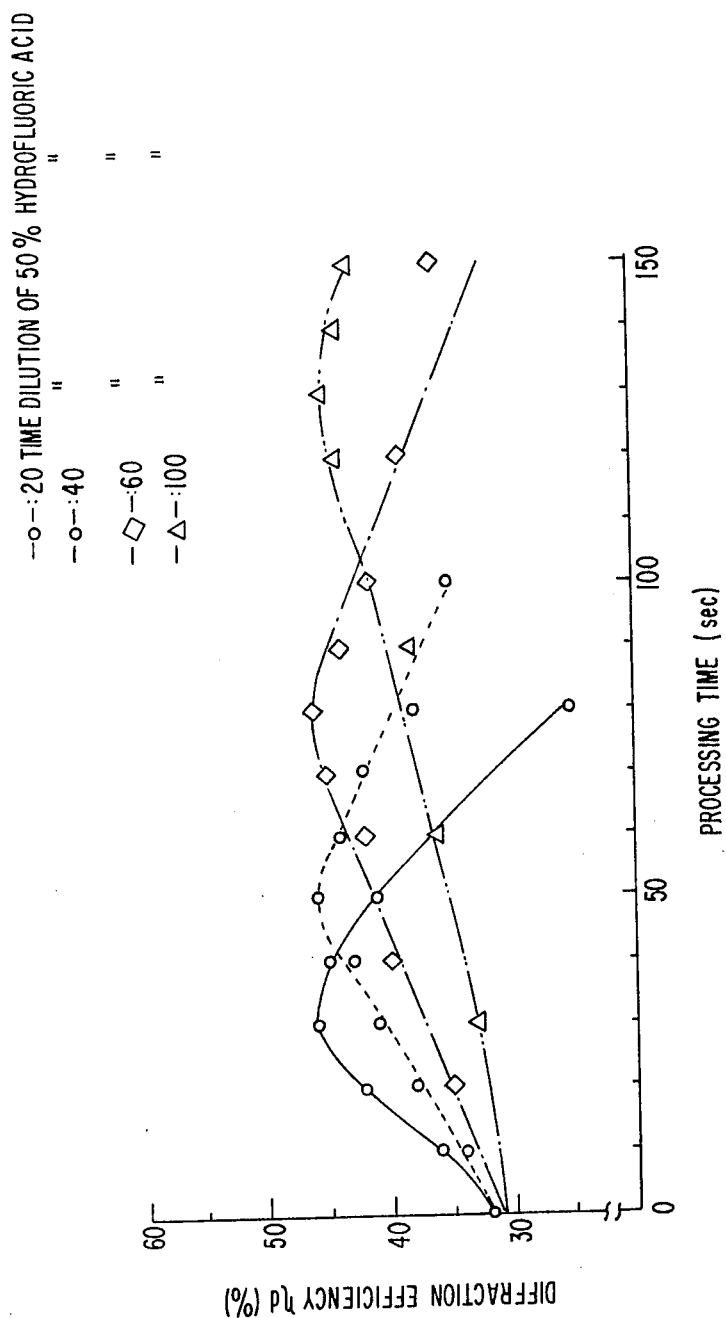

4,433,893

PROCESS FOR PRODUCING HOLOGRAMS

FIELD OF THE INVENTION

The present invention relates to a process for producing holograms and, particularly, to a process for producing holograms having excellent durability and high diffraction efficiency.

BACKGROUND OF THE INVENTION

Those skilled in the art of practically useful holograms have for some time made considerable efforts to attain high diffraction efficiency and excellent durability, i.e. to obtain holograms that do not change due to exposure to light or variation of humidity. Studies have been carried out in this area as relates to recording materials for holograms and treatment thereof. Thus, many recording materials such as silver salt photosensitive materials, photoresist, thermoplastic resins, photopolymers or bichromic acid-gelatine, etc. and methods of treating thereof have been examined. Among these arts, it has been known that holograms obtained by bleaching a silver salt photosensitive material and holograms using bichromic acid-gelatine have a diffraction efficiency of higher than 50% when they are examined just after production thereof. Regretfully, however, these holograms have problems because the gelatine layer composing the holograms swells or contracts by variation of humidity to cause deterioration of the diffraction efficiency or variation of the optimum reproducing condition. Furthermore holograms obtained by bleaching silver salt photosensitive materials have problems that, since they contain silver compounds, the compounds are printed out to cause coloration upon exposure to reproduction light such as laser rays, etc., resulting in deterioration of the diffraction efficiency. Under existing circumstances, a maximum diffraction efficiency of 15% can be obtained when using the prior recording materials except for the silver salt photosensitive materials and the bichromic acid-gelatine materials.

There have been attempts at improving the durability of holograms. However, processes for producing glass holograms having an uneven surface are comparatively new arts. One of the process for producing glass holograms has been described in U.S. Pat. No. 4,056,395. According to this process, unevenness corresponding to a hologram pattern is formed on the glass base by forming a metal silver image corresponding to the hologram pattern on a recording material comprising a silver halide photographic emulsion layer provided on a glass base and thereafter carrying out ion-etching. In addition, glass holograms can be produced by a process which comprises forming a relief image of a photoresist corresponding to a hologram pattern on a recording material comprising a photoresist sensitive layer provided on a glass base or forming an image of refractivity of gelatine corresponding to a hologram pattern on a recording material comprising a bichromic acid-gelatine sensitive layer provided on a glass base and subsequently carrying out ion-etching to form unevenness corresponding to the hologram pattern on the glass base (see, for example, U.S. Pat. No. 3,733,258).

The holograms produced as described above are comprised of only glass. Accordingly, durability which is required in holograms obtained by bleaching silver salt photosensitive materials or holograms using bichromic acid-gelatine is improved. However, these glass holograms are not desirable because the diffraction efficiency cannot be increased too much, and the diffraction efficiency obtained in an example described in U.S. Pat. No. 4,056,395 is at most 15%.

Therefore, high diffraction efficiency and excellent durability are not both attained by the above described hologram recording materials and methods of treating thereof. This fact is a serious obstacle to practical use of the holograms.

SUMMARY OF THE INVENTION

An object of the present invention is to provide holograms having excellent durability and high diffraction efficiency and the process therefor.

Another object of the present invention is to enhance practicality of the holograms by providing holograms having excellent durability and high diffraction efficiency.

A further object of the present invention is to improve insufficient diffraction efficiency of glass holograms which have excellent durability.

The above objects can be achieved by surface-treating a glass hologram having an uneven surface with hydrofluoric acid.

BRIEF DESCRIPTION OF THE DRAWINGS

The FIGURE is a graph showing the relationship between diffraction efficiency and processing time with hydrofluoric acid.

DETAILED DESCRIPTION OF THE INVENTION

This invention can be effectively applied to any conventional glass holograms using recording material having on a glass base a silver halide emulsion layer, a photoresist sensitive layer, a bichromic acid-gelatine sensitive layer or a photopolymer layer as described in, for example, British Pat. No. 1,481,623, and U.S. Pat. Nos. 4,056,395 and 3,733,258, whereby the diffraction efficiency can be markedly increased.

The holograms having excellent durability and high diffraction efficiency of this invention are produced in the following manner, but this invention is not limited thereto.

A silver halide emulsion which may be optically sensitized by a conventional method is formed on a glass base or a chromium-coated glass base. Any glass base which is used for conventional glass holograms can be used in this invention. Subsequently, the recording layer is exposed to two coherent laser beams to record a hologram pattern on the recording layer in a conventional manner and then developed and fixed using a developing solution and a fixing solution which are conventionally used in photographic processings. Thereafter the resulting recording material is subjected to ion-etching or sputter-etching to thereby form unevenness corresponding to the recorded hologram pattern on the glass base. The etching process may be carried out by ion-etching by collision of high energy ions or etching by neutral grains. It is preferred that the recording layer is baked to decompose a binder thereof prior to the etching when the unevenness on the glass is required to be enhanced. The glass hologram thus formed is highly durable but do not possess a high diffraction efficiency.

The diffraction efficiency of the glass hologram can be markedly increased by surface-treating the hologram with hydrofluoric acid, for example, immersing the hologram in an aqueous solution of hydrofluoric acid. The processing time varies depending upon the concentration of the hydrofluoric acid solution and a kind of glass base to be used, and in general the immersion of the hologram in a solution obtained by diluting 20 times, 40 times, 60 times and 100 times 50% hydrofluoric acid for 30, 50, 80 and 130 seconds, respectively, provides a similar degree of increased diffraction efficiency. The relationship between the processing time and the resulting diffraction efficiency in the surface-treatment of a glass hologram having the diffraction efficiency of about 30% is illustrated in the FIGURE. In an extreme case, the present invention can be carried out with vapour of hydrofluoric acid without diluting.

The surface treatment with hydrofluoric acid may be carried out intermittently by separated plural steps.

It is preferred that the back surface (i.e., opposite to the hologram surface) of the glass hologram be kept from the action of hydrofluoric acid by attaching an adhesive tape thereon when a transmission-type glass hologram is produced while such a step is not necessary in the production of a reflection-type glass hologram.

In the following, preferred examples of the present invention are illustrated.

EXAMPLE 1

1400 ml of a silver bromide emulsion (average particle size of silver bromide was about 0.06 microns) was prepared with using 50 g of gelatine and 188 g of silver bromide. After the emulsion was spectrally sensitized so as to be sensitive to 510 m$\mu$–530 m$\mu$ by adding 0.25 g of 4-methyl-2,3-diethoxythiazolocarbocyanine iodide, it was applied to a silicate glass plate having a chromium layer 0.1$\mu$ thick formed by vacuum evaporation of chromium. The emulsion layer was applied in a dry thickness of about 2.2$\mu$. This recording material was exposed to two coherent beams of argon laser (wavelength: 515 m$\mu$) to form a simple lattice hologram pattern on the emulsion layer. The angle of the two beams of light was 21° and, accordingly, the space frequency of the hologram pattern was about 700 LP/mm. The intensity of the two beams of light was 3 $\mu$W/cm$^2$, and the exposure time was 4 seconds. Then, it was developed with a developing solution having the following composition (at 20° C. for 5 minutes) and fixed with a fixing solution having the following composition (at 20° C. for 1 minute) to obtain a silver image.

| Developing solution: | |
|---|---|
| 1-Phenyl-3-pyrazolidone | 0.5 g |
| Sodium sulfite | 50 g |
| Hydroquinone | 12 g |
| Sodium carbonate (monohydrate) | 60 g |
| Potassium bromide | 2 g |
| Benzotriazole | 0.2 g |
| 1-Phynylmercaptotetrazole | 5 ml |
| Phenazine-2-carboxylic acid | 1 g |
| Water | to make 1 liter |
| Fixing solution: | |
| 70% aqueous solution of ammonium thiosulfate | 200 cc |
| Boric acid | 8 g |
| Sodium sulfite | 15 g |
| Glacial acetic acid | 16 cc |
| Aluminium sulfate | 10 g |
| Sulfuric acid | 2 cc |
| Water | to make 1 liter |

After the material was dried, it was subjected to etching for 30 minutes in a sputter-etching apparatus (Model DEM-301 produced by Nichiden Varian Co.). Sputter-etching was carried out under conditions of frequency: 13.56 MHz, high frequency output: 400 W, distance between electrodes: 50 mm and gas pressure: 2.0×10$^{-2}$ torr (freon). After carrying out the sputter-etching, the material was dipped in an aqueous solution of sodium hypochlorite having available chlorine of 10% for 2 minutes to remove the residual gelatine layer and it was then dipped in an etching solution having the following composition for 2 minutes to remove the residual chromium layer.

| Etching solution: | |
|---|---|
| Ammonium ceric nitrate | 164.5 g |
| 70% perchloric acid | 10 ml |
| Water | to make 1 liter |

The resulting glass hologram had the diffraction efficiency of 30%. Further, this glass hologram was dipped in a solution obtained by diluting 20 times 50% hydrofluoric acid for 30 seconds to treat the surface thereof. The diffraction efficiency of the final resulting glass hologram was 48%. In this surface treatment, the back of the hologram was covered with an adhesive tape comprised of a Mylar base so that the back was not affected by the solution of hydrofluoric acid.

EXAMPLE 2

The same procedure as in Example 1 was carried out except that the final surface treatment by a solution of hydrofluoric acid was carried out under the following condition. Namely, the surface treatment was carried out by dipping for 2 minutes in a solution obtained by diluting 50 times 50% hydrofluoric acid. In this case, the back of the glass hologram was covered with an adhesive tape comprising a Mylar base. Although the diffraction efficiency of the glass hologram prior to the surface treatment by hydrofluoric acid was 30%, after treatment it was 46%.

EXAMPLE 3

1400 ml of a silver bromide emulsion (average particle size of silver bromide was about 0.06 microns) was producing with using 50 g of gelatine and 188 g of silver bromide. After the emulsion was spectrally sensitized so as to be sensitive to 510 m$\mu$–530 m$\mu$ by adding 0.25 g of 4-methyl-2,3-diethoxythiazolocarbocyanine iodide, it was applied to a soda lime glass plate in a dry thickness of about 2.2$\mu$. Using this recording material, a silver image was obtained by carrying out exposure to light, development and fixing by the same manner as in Example 1. Subsequently, the resulting material was subjected to etching for 20 minutes in a sputter-etching apparatus (Model DEM-301 produced by Nichiden Varian Co.). The sputter-etching was carried out under the same conditions as in Example 1. After carrying out the sputter-etching, the material was dipped in an aqueous solution of sodium hypochlorite having available chlorine of 10% for 2 minutes to remove the residual gelatine layer, by which a glass hologram was obtained. The diffraction efficiency of the glass hologram was 28%. However, when the surface treatment with the aqueous solution of hydrofluoric acid was carried out in the same manner as in Example 1, the diffraction efficiency of the final hologram was 45%.

EXAMPLE 4

Photoresist "AZ-1350" produced by Shipley Co. was coated on a soda lime glass plate in a dry thickness of about $2\mu$. This recording material was exposed to two coherent beams of argon laser (wavelength: 488 m$\mu$) to thereby form a simple lattice hologram pattern on the photoresist layer. The angle of the two beams of light was about 20°, and, accordingly, the space frequency of the hologram pattern was about 700 LP/mm. The intensity of the two beams of light was 450 $\mu W/cm^2$ and the exposure time was 20 minutes. Then it was developed with a developing solution for "AZ-1350" (at 20° C. for 1 minute), followed by water-washing and drying to obtain a photoresist hologram. Thereafter, the material was subjected to etching for 25 minutes in a sputter-etching apparatus (Model DEM-301 produced by Nichiden Varian Co.). The conditions of the sputter-etching were the same as in Example 1. After carrying out the sputter-etching, the material was dipped in an acetone solution to remove the residual photoresist layer.

The resulting glass hologram had the diffraction efficiency of 31%. When the glass hologram was subjected to the same surface treatment as in Example 1, the diffraction efficiency was increased to 45%.

As described in four examples, the glass holograms according to the present invention which were subjected to a surface treatment by the action of hydrofluoric acid have remarkably high diffraction efficiency as compared with the prior glass holograms. They have the diffraction efficiency of higher than 45% and near 50%, and it can be said that the diffraction efficiency of them approaches that of holograms produced by bleaching silver salt sensitive materials. Further, it can be said that a chief problem of obstructing practical use of holograms can be dissolved by providing glass holograms according to the present invention, because they also have excellent durability (change or deterioration does not occur by exposing to light or variation of humidity) as shown in prior glass holograms.

In the present invention, various embodiments can be carried out without being limited to the above described three examples.

As be described above, according to the present invention, glass holograms having remarkably excellent durability and high diffraction efficiency of about 50% can be produced. Therefore, a practical and useful hologram is disclosed herein.

While the invention has been described in detail and with reference to specific embodiments thereof, it will be apparent to one skilled in the art that various changes and modifications can be made therein without departing from the spirit and scope thereof.

What is claimed is:

1. In a process for producing glass holograms having an uneven surface, the improvement wherein a surface of said glass holograms is subjected to a surface treatment with hydrofluoric acid.

2. A process of claim 1, wherein said hydrofluoric acid is 50% hydrofluoric acid diluted 20 times to 100 times and is applied to said surface for 30 to 130 seconds.

* * * * *